United States Patent
Kato et al.

(10) Patent No.: US 11,444,004 B2
(45) Date of Patent: Sep. 13, 2022

(54) COOLER

(71) Applicants: FUJI ELECTRIC CO., LTD., Kawasaki (JP); WASEDA UNIVERSITY, Tokyo (JP)

(72) Inventors: Ryoichi Kato, Matsumoto (JP); Yoshinari Ikeda, Matsumoto (JP); Hiromichi Gohara, Matsumoto (JP); Tomoyuki Miyashita, Tokyo (JP); Shingo Otake, Tokyo (JP)

(73) Assignees: FUJI ELECTRIC CO., LTD., Kawasaki (JP); WASEDA UNIVERSITY, Tokyo (JP)

( * ) Notice: Subject to any disclaimer, the term of this patent is extended or adjusted under 35 U.S.C. 154(b) by 305 days.

(21) Appl. No.: 16/806,490

(22) Filed: Mar. 2, 2020

(65) Prior Publication Data
US 2020/0321266 A1   Oct. 8, 2020

(30) Foreign Application Priority Data
Apr. 5, 2019   (JP) .............................. JP2019-072913

(51) Int. Cl.
| | | |
|---|---|---|
| *H01L 23/34* | (2006.01) | |
| *H01L 23/473* | (2006.01) | |
| *H05K 7/20* | (2006.01) | |
| *F28F 3/02* | (2006.01) | |
| *H01L 23/373* | (2006.01) | |
| *H01L 23/40* | (2006.01) | |

(52) U.S. Cl.
CPC .............. *H01L 23/473* (2013.01); *F28F 3/02* (2013.01); *H01L 23/3735* (2013.01); *H01L 23/40* (2013.01); *H05K 7/20927* (2013.01)

(58) Field of Classification Search
CPC .......... H01L 23/40; H01L 23/473; F28F 3/02; H05K 7/20927
USPC ......................................... 257/713–714, 706
See application file for complete search history.

(56) References Cited

U.S. PATENT DOCUMENTS

| | | | | |
|---|---|---|---|---|
| 4,027,997 A | * | 6/1977 | Bryans .................. | F04D 29/441 415/207 |
| 4,561,040 A | * | 12/1985 | Eastman ............... | H01L 23/473 257/713 |
| 4,729,060 A | * | 3/1988 | Yamamoto .......... | H01L 23/4336 257/E23.091 |
| 4,765,397 A | * | 8/1988 | Chrysler ............... | H01L 23/473 257/E23.098 |

(Continued)

FOREIGN PATENT DOCUMENTS

JP       2002-141164 A       5/2002

*Primary Examiner* — Nitin Parekh
(74) *Attorney, Agent, or Firm* — Manabu Kanesaka (57) ABSTRACT

A cooler of the present invention is provided with a case having a top plate, a bottom plate, and a side plate, cooling fins disposed inside the case, and a flow path for cooling fluid that comes into contact with the cooling fins and that flows through the interior of the case, the cooler cooling an object to be cooled in contact with the top plate or the bottom plate. The cooling fins have a shaft part and vane parts that protrude outward from the shaft part and extend spirally in the axial direction; the overall cooling fin configuration constituting a quadrangular column shape. The cooling fins are disposed in contact with at least the top plate and the bottom plate, and the flow path has a spiral-formed configuration formed by the vane parts, the top plate, and the bottom plate.

9 Claims, 9 Drawing Sheets

(56) References Cited

U.S. PATENT DOCUMENTS

| | | | | |
|---|---|---|---|---|
| 4,928,207 A * | 5/1990 | Chrysler | ............... | H01L 23/427 |
| | | | | 257/E23.093 |
| 5,390,077 A * | 2/1995 | Paterson | ............ | H01L 23/4093 |
| | | | | 29/890.032 |
| 5,932,940 A * | 8/1999 | Epstein | ................... | F01D 25/20 |
| | | | | 60/39.35 |
| 2006/0010871 A1 * | 1/2006 | Frechette | ................ | F01K 13/00 |
| | | | | 60/670 |
| 2019/0021186 A1 * | 1/2019 | Poltorak | ............. | H01L 23/473 |

* cited by examiner

FIG. 3(a)
UPPER SURFACE VIEW

FIG. 3(b)
ENLARGED VIEW (REGION R1)

FIG. 3(c)
PERSPECTIVE VIEW (COOLING FIN 8A)

FIG. 7(a)
SIDE SURFACE VIEW

FIG. 7(b)
ENLARGED VIEW (REGION R2)

Fig. 8(a)
X-Z PLANE

| FIN WIDTH x1 [mm] | FIN HEIGHT z1 [mm] | VANE WIDTH d1 [mm] | VANE INTERVAL d2 [mm] |
|---|---|---|---|
| 8.0 | 8.0 | 1.0 | 9.0 |

Fig. 8(b)
Y-Z PLANE

| ENTIRE LENGTH y1 [mm] | FIN WIDTH y2 [mm] | FIN INTERVAL y3 [mm] | FIN PITCH y4 [mm] | NUMBER OF ROTATIONS [TIMES] |
|---|---|---|---|---|
| 60.0 | 0.5 | 1.55 | 16.4 | 3.66 |

COOLER

RELATED APPLICATIONS

The present application is based on, and claims priority from, Japanese Application No. 2019-072913 filed Apr. 5, 2019, the disclosure of which is hereby incorporated by reference herein in its entirety.

BACKGROUND OF THE INVENTION

1. Field of the Invention

The present invention relates to a cooler for cooling a semiconductor element, etc., with the aid of a fluid for cooling, and to a semiconductor module provided with the cooler.

2. Description of the Related Art

Conventionally, power semiconductor modules, etc., used as switching devices for power conversion applications, coolers have been used as a heat-radiating member in order to minimize adverse effects due to heat generated from the circuit.

For example, the cooler of Patent Document 1 noted below includes an element joining plate on which a joining surface of a semiconductor switching element such as a SIT, FET, or IGBT is attached in a joined state, a lower surface plate formed in substantially the same shape as the element joining plate, and a side plate having a square shape as viewed from above which joins and connects the element joining plate and an outer peripheral part of the lower surface plate. A plurality of fins are integrally affixed to the reverse surface of the element joining plate and the inner surface of the lower surface plate of the cooler.

In the cooler, the fins are provided at an incline along the direction in which cooling water flows in the flow path. The fins may be inclined along the flow direction or along the counter-flow direction. The contact area for each fin of the cooling water flowing through the flow path can thereby be increased, and the cooler can be efficiently cooled by the cooling water (paragraphs [0009], [0017], FIG. 5).

RELATED ART DOCUMENTS

Patent Documents

Patent Document 1: Japanese Laid-Open Patent Application No. 2002-141164

SUMMARY OF THE INVENTION

However, the cooler of Patent Document 1 has a structure for the purpose of efficiently cooling the fins by increasing the contact time between the fins and the cooling water, and in order to provide a large number of fins in a single flow path, an intricate and complicated flow path results. For this reason, there is a greater possibility of pressure loss in the cooling water. Therefore, a fin structure with low pressure loss in the cooling water and high heat dissipation performance is ideal, and further improvements have been required.

In view of such problems, it is an object of the present invention to provide a cooler having a structure in which pressure loss in the cooling fluid is low and cooling efficiency is high.

In order to achieve the foregoing object, a first aspect of the present invention is a cooler provided with a case having a top plate, a bottom plate, and a side plate, cooling fins disposed inside said case, and a flow path for cooling fluid that comes into contact with said cooling fins and that flows through the interior of the case, the cooler being for cooling an object to be cooled in contact with the top plate or the bottom plate, the cooler including: the cooling fins have a shaft part and vane parts that protrude outward from the shaft part and extend in the axial direction so as to form a spiral configuration, the overall cooling fin configuration constituting a shape of a quadrangular column and being disposed in contact with at least the top plate and the bottom plate; and the flow path has a spiral-formed configuration formed by the vane parts, the top plate, and the bottom plate.

The cooler of the present invention can cool a semiconductor element or other object that is in contact with the top plate or the bottom plate, by using a cooling fluid (e.g., water) flowing through the cooling fins between the top plate and the bottom plate. The overall cooling fin configuration constitute a shape of a quadrangular column, and are therefore easily accommodated in the cooler case and easily brought into contact with the top plate and the bottom plate disposed on the upper surface side and the lower surface side of the case.

The cooling fins have a shaft part and vane parts that protrude outward from the shaft part and extend spirally in the axis direction, and a spiral flow path is therefore formed by the vane parts, the top plate, and the bottom plate. For this reason, the cooling fluid that has flowed into the cooling fins proceeds through the flow path at a relatively high flow rate while turning and moving in the vertical direction. The cooling fluid, having increased in temperature upon contacting the object to be cooled, is quickly replaced by circulation, and a cooler with low pressure loss and high cooling efficiency can therefore be realized.

In the cooler of the first aspect, it is preferable that four to ten of the vane parts are arranged at equidistant intervals around the shaft part.

The cooling fluid that has flowed into the cooling fins can thereby be made to flow evenly through the flow path around the shaft part, and an object to be cooled that has been brought into contact with the cooling fins in any direction can therefore be cooled. Even more preferably, the vane parts of the cooling fins are present in a quantity of six to eight and are disposed at equidistant intervals around the shaft part.

In the cooler of the first aspect, it is preferable that the axial pitch of the vane parts has a length amounting to 1.5 to 6.25 times the height of the quadrangular column.

The pressure loss of the cooling fluid flowing through the flow path can be reduced by setting the axial pitch (fin pitch) of the vane parts of the cooling fin to a length amounting to 1.5 to 6.25 times the height of the quadrangular column. The axial pitch (fin pitch) of the vane parts of the cooling fins is preferably a length amounting to 2 to 5 times the height of the quadrangular column.

In the cooler of the first aspect, it is preferable that the cross-sectional area of the shaft part is 10 to 60% of the cross-sectional area of the quadrangular column in the cross section axially perpendicular to said quadrangular column.

A suitable amount of cooling fluid flows into the cooling fins by making the cross-sectional area of the shaft part be 10 to 60% of the cross-sectional area of the quadrangular column in the cross section axially perpendicular to said quadrangular column. It is thereby possible to make an adjustment so that pressure loss is low and the amount of cooling fluid required for cooling is allowed to flow. The cross-sectional area of the shaft part of the cooling fins is more preferably 65 to 85% of the cross-sectional area of the quadrangular column in the cross section axially perpendicular to said quadrangular column.

In the cooler of the first aspect, it is preferable that the thickness of the vane parts is 10 to 60% of the length obtained by dividing the axial pitch of the vane parts by the number of vanes.

The pressure loss of the cooling fluid flowing through the flow path can be reduced by setting the thickness of the vane parts of the cooling fin to be 10 to 60% of the length obtained by dividing the axial pitch (fin pitch) of the vane parts by the number of vanes.

In the cooler of the first aspect, it is preferable that a plurality of the cooling fins are disposed in parallel inside the case.

By arranging a plurality of cooling fins in parallel in the case, there are numerous flow paths through which the cooling fluid flows formed in the cooler. Accordingly, cooling efficiency can be further improved.

In the cooler of the first aspect, it is preferable that a straight fin is disposed between the parallel cooling fins, and in contact with the cooling fins.

When the cooling fins are disposed in parallel inside the case, the straight fin is disposed between the cooling fins. As a result, the cooling fluid flowing through the flow path of one cooling fin will not flow into the flow path of the adjacent cooling fin; therefore, turbulent flow does not occur and pressure loss can be minimized.

In the cooler of the first aspect, it is preferable that, in mutually adjacent cooling fins, the vane parts are in mutual contact, and the spiral directions of the vane parts are in opposite directions.

When the cooling fins are disposed in parallel inside the case, the vane parts of adjacent cooling fins are in contact with each other and disposed so that the spiral directions of the vane parts are in opposite directions. As a result, the cooling fluid flowing through the flow path of one cooling fin does not generate a counter flow even if the cooling fluid flows into the flow path of the adjacent cooling fin, and pressure loss can therefore be minimized.

In order to achieve the foregoing object, a second aspect of the present invention is a semiconductor module comprising: a semiconductor element; a laminated substrate on which the semiconductor element is mounted and which has a structure in which an upper surface and lower surface of an insulation substrate are sandwiched by electroconductive plates; and a cooler through which cooling fluid for cooling the semiconductor element flows, the cooler being joined to a side of the laminated substrate on which the semiconductor element is not mounted. And, in the semiconductor module, the cooler is any of the above-described first aspects.

In the semiconductor module of the present invention, the semiconductor element is mounted on the laminated substrate, and the cooler is joined to side of the laminated substrate on which the semiconductor element is not mounted. A cooling fluid for cooling the semiconductor element flows to the cooler, and by making the laminated substrate of a material having high thermal conductivity, whereby the semiconductor element can be cooled.

In the cooler (first aspect), a spiral-formed flow path is formed by the vane parts, the top plate, and the bottom plate. For this reason, the cooling fluid that has flowed into the cooling fins proceeds through the flow path at a relatively high flow rate while swirling and moving in the vertical direction. The cooling fluid, having risen in temperature upon contacting the semiconductor element, is quickly replaced by circulation, and it is therefore possible to realize a semiconductor module in which the cooling efficiency for the semiconductor element is improved.

DESCRIPTION OF THE PREFERRED EMBODIMENTS

Embodiments of the cooler and the semiconductor module of the present invention are described below with reference to the attached drawings.

[Semiconductor Module]

Figure 1:
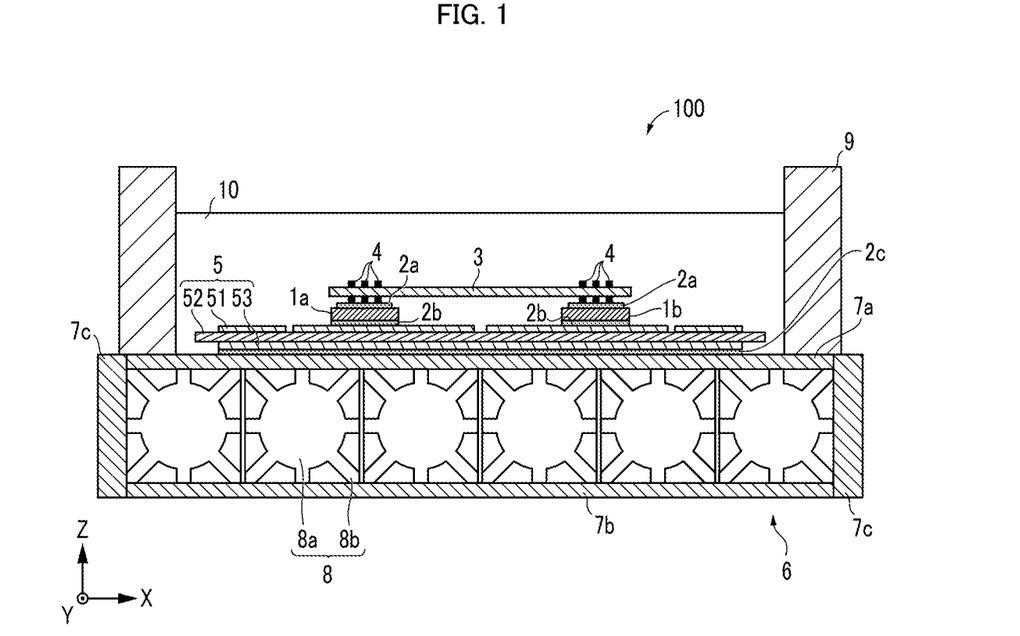
FIG. 1 is a cross-sectional view of the semiconductor module according to an embodiment of the present invention.

FIG. 1 is a cross-sectional view of the semiconductor module 100 of an embodiment of the present invention. Examples of the semiconductor module 100 include those mainly composed of two semiconductor elements 1a, 1b, a wiring board 3, a laminated substrate 5, a cooler 6, a case 9, etc. As shown in the drawing, the semiconductor elements 1a, 1b, the wiring substrate 3, and the laminated substrate 5 are accommodated in the case 9 and molded with a resin 10. In addition, a cooler 6 comprising a cooler case 7 and cooling fins 8 for cooling the semiconductor elements 1a, 1b is disposed on the lower surface of the case 9.

The semiconductor elements 1a, 1b are, for example, transistors including insulated gate bipolar transistors (IGBTs) and power metal oxide semiconductor field effect transistors (MOSFETs). It is also possible to use a reverse blocking-IGBT (RB-IGBT) or a reverse conducting-IGBT (RC-IGBT) in which the above-mentioned transistors are formed in a vertical direction in a single semiconductor element.

The wiring substrate 3 is disposed on the upper surface side of the semiconductor elements 1a, 1b. The wiring substrate 3 has a structure in which both surfaces of an insulation substrate are covered with metal foil, and the metal foil on the lower surface side is formed so as to face the semiconductor elements 1a, 1b. The insulation substrate is preferably made of a material having a low dielectric constant and high thermal conductivity, and it is possible to use, e.g., a resin insulating material that includes an epoxy resin or other resin, and $Si_3N_4$, AlN, $Al_2O_3$, or another ceramic. The metal foil is preferably made of a material having low electrical resistance and high thermal conductivity, and it is possible to use, e.g., Cu.

Pins 4 are joined at one end to the electrodes on the upper surface side of the semiconductor elements 1a, 1b by a metal joining member 2a, and the other end is used for connection to the wiring substrate 3. The pins 4 are a metal having low electrical resistance and high thermal conductivity, and it is possible to use, e.g., Cu. The metal joining member 2a may be solder or a member having metallic microparticles such as silver.

As shown in the drawings, a plurality of the pins 4 are preferably disposed on the semiconductor elements 1a, 1b. Using such a structure makes it possible to reduce electrical resistance and improve thermoconductive performance.

The laminated substrate 5 is composed of an insulation substrate 52, a first electroconductive plate 51 formed on the upper surface side of the insulation substrate 52, and a second electroconductive plate 53 formed on the lower surface side of the insulation substrate 52. As for the insulation substrate 52, a material having excellent electrical insulation and thermal conductivity can be used. $Al_2O_3$, AlN, and $Si_3N_4$ are examples of the material of the insulation substrate 52. Materials that are electrically resistant as well as thermally conductive are particularly preferred in high withstand voltage applications; AlN and $Si_3N_4$ can be used, but there is no limitation thereto.

The first electroconductive plate 51 and the second electroconductive plate 53 may be made of Cu, Al, or another metal material (metal foil) that has excellent electroconductivity and processability. Cu or Al that has been subjected to Ni plating or other treatment may be used with the aim of rust prevention or other purposes. Examples of a method for arranging the conductive plates 51 and 53 on the surface of the insulation substrate 52 include direct joining (direct copper bonding), and brazing material joining (active metal brazing).

The laminated substrate 5 is disposed on the lower surface side of the semiconductor elements 1a, 1b. The laminated substrate 5 has a structure in which both surfaces of the insulation substrate 52 are covered with Cu or another metal foil, and is electrically separated from the metal foil by the insulating property of the insulation substrate 52. Specifically, the first electroconductive plate 51 and the insulation substrate 52 are electrically insulated. The peripheral edge of the insulation substrate 52 preferably protrudes outside the peripheral edges of the electroconductive plates 51, 53. The above-described example is the case in which the insulation substrate 52 has a second conductive plate 53 such as a backside copper foil. However, the insulation substrate and the cooler may be thermally joined by a joining member having excellent thermal conductivity (a mode in which heat is efficiently conducted).

The semiconductor elements 1a, 1b are mounted on the laminated substrate 5. Specifically, the lower surface side of the semiconductor elements 1a, 1b and the first electroconductive plate 51 on the upper surface side of the laminated substrate 5 are electrically and thermally joined by a metal joining member 2b. The metal foils on the upper surface side and the lower surface side of the laminated substrate 5 are electrically separated from each other, but the thermal conductivity therebetween is good.

The second electroconductive plate 53 on the lower surface side of the laminated substrate 5 and the outer wall (top plate 7a) of the cooler 6 are joined by a metal joining member 2c. In other words, the semiconductor elements 1a, 1b are disposed on the upper part of a top plate 7a of the cooler 6. The metal joining members 2b, 2c may be solder or a member having metallic microparticles such as silver having excellent thermal conductivity and electroconductivity.

The laminated substrate 5 and the cooler 6 are thermally joined by a joining member having excellent thermal conductivity. Therefore, the joining member may be a metal joining member having electroconductivity, or a thermal compound mainly composed of a base oil and a ceramic filler. The thermal conductivity of the above-described joining member is preferably 1 W/m·K or more, and more preferably 10 W/m·K or more.

The cooler 6 is composed of a cooler case 7 comprising a top plate 7a, a bottom plate 7b, and side plate 7c, and cooling fins 8. The cooling fins 8 are accommodated inside the cooler case 7. The cooling fins 8, which are described in detail further below, are composed of a shaft part 8a and vane parts 8b that protrude outward from the shaft part 8a and extend spirally in the long axis direction (Y-axis direction). Al, Cu, or another metal having a high thermal conductivity is used as a material for the top plate 7a, bottom plate 7b, and cooling fins 8 constituting the flow path.

[Cooler]

The details of the cooler 6 included in the semiconductor module 100 are described next with reference to FIG. 2.

Figure 2:
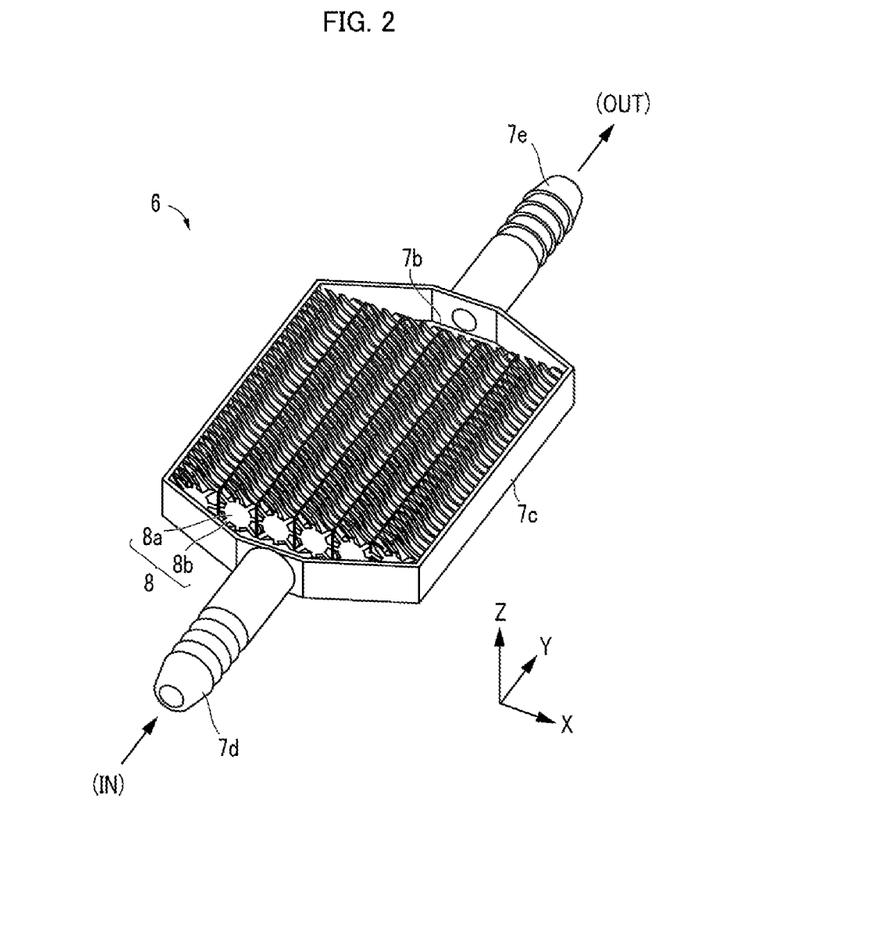
FIG. 2 is perspective view of the cooler (without a top plate)

FIG. 2 is a perspective view of the cooler 6 (without the top plate 7a). The side plate 7c of the cooler case 7 is not limited to being octagonal in shape, but the cooler case 7 has an inlet 7d and an outlet 7e for water or another cooling fluid.

The cooling fins 8 are composed of the shaft part 8a and the vane parts 8b (see FIG. 1), and constitutes square column as a whole. For this reason, the cooling fins 8 are easily accommodated in the cooler case 7 and are easily brought into contact with the top plate and the bottom plate disposed on the upper surface side and the lower surface side thereof. As illustrated, six cooling fins 8 are arranged in parallel inside the cooler case 7, and are arranged so as to be parallel to the flow of the cooling fluid. The vane parts 8b form fins extending in the long axis direction (Y-axis direction), and the spaces surrounded by the top plate 7a and the bottom plate 7b, in which such other members may be included, are each independent flow paths.

Cooling fluid that has flowed in from the inlet 7d and entered the flow paths constituted by the top plate 7a, the bottom plate 7b, the cooling fins 8, etc., proceeds in the long axis direction at a relatively high flow rate while turning up and down and left and right, and is discharged from the outlet 7e. In this configuration, the semiconductor elements 1a, 1b, which are the objects to be cooled, are disposed on the top plate 7a side of the cooler case 7 (see FIG. 1).

The heat generated by the semiconductor element 1a passes along the laminated substrate 5 and propagates to the top plate 7a side of the cooler 6, and further to the cooling fins 8 and other metallic members. For this reason, the cooling fluid, having risen in temperature upon contacting the top plate 7a on the semiconductor elements 1a, 1b side, is quickly replaced by circulation, and the cooling fins 8 are cooled, so that the cooling efficiency can be improved.

The object to be cooled may be disposed on the bottom plate 7b side of the cooler case 7, or may be disposed on the side plate 7c (Y-axis direction), though the surface area is small. Further, the number of cooling fins 8 accommodated in the cooler case 7 is not limited to six.

[Cooling Fins]

The cooling fins 8 shall now be described in further detail with reference to FIGS. 3 to 9. The characteristics of the cooling fins 8 was obtained using thermal fluid analysis software by evaluating the temperature and pressure loss when changing the shape parameter of the flow path part and other factors, and by furthermore actually producing prototypes of the cooling fins including flow path part and the cooler therewith.

Figure 3A:
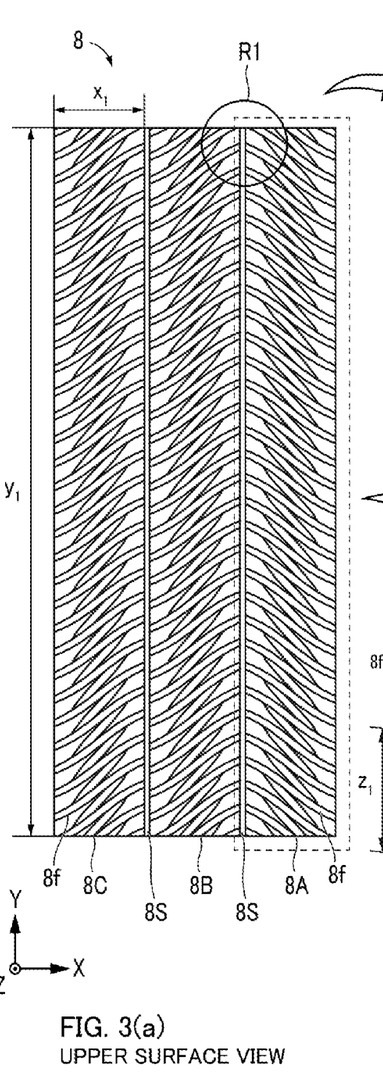
FIG. 3(a) is an upper surface view of the cooling fins (3 fins)

First, FIG. 3(a) shows the state (without the top plate 7a) of the cooling fins 8 as seen from above (+Z-axis direction). The cooling fluid flows in from the −Y-axis direction, and flows through the flow path formed by the cooling fins 8. Six cooling fins 8 are actually disposed in parallel, as shown in the cooler 6 of FIG. 2, but in this configuration, three of the six are shown (cooling fins 8A, 8B, 8C). Arranging a plurality of cooling fins 8 in parallel makes it possible to increase cooling efficiency because a plurality of flow paths is formed inside the cooler 6.

[The Case with Straight Fins]

Figure 3B:
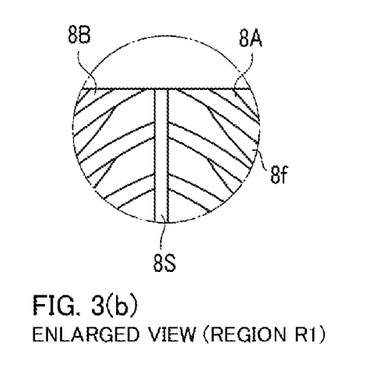
FIG. 3(b) is an enlarged view of the region R1 of the cooling fins.

FIG. 3(b) is an enlarged view of region R1 of FIG. 3(a). As shown in the drawing, in this embodiment, a plate-shaped straight fin 8S is inserted between mutually adjacent cooling fins 8A, 8B. The straight fin 8S is in contact with both curved fins 8f of the cooling fins 8A, 8B. With such an arrangement, the cooling fluid that flows through the flow path of the cooling fin 8A does not flow into the flow path of the cooling fin 8B, and therefore no turbulent flow occurs and pressure loss can be minimized.

Figure 3C:
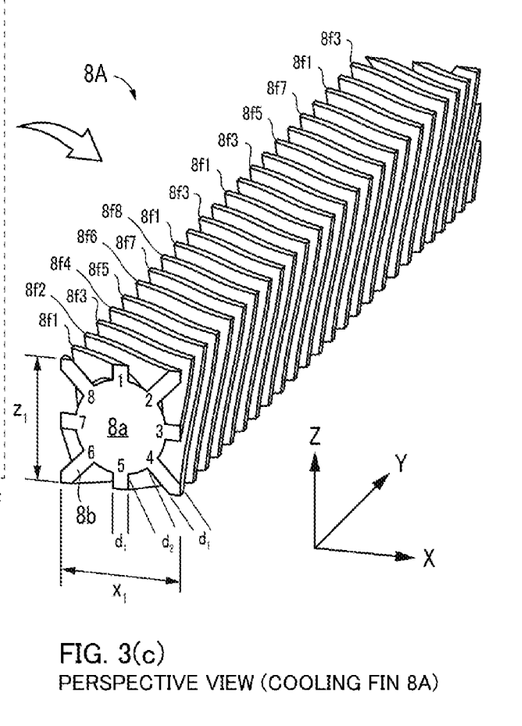
FIG. 3(c) is a perspective view of the cooling fin (1 fin)

The spiral directions of the vane parts 8b of the cooling fins 8A, 8B may be the same or opposite. As shown in FIG. 3(c), the vane parts 8b are rectangular on the X-Z plane, but extend in the Y-axis direction to form a fin with curve (curved fin).

It was found by experimentation that when the spiral direction of the cooling fins 8 is adjacent to the right rotation (clockwise) and the left rotation (counterclockwise) as viewed from the cooling fluid inflow direction, arrangement in the sequence of right rotation and left rotation from the left is preferred.

In FIG. 3(a), the cooling fin 8C, 8B preferably have a right rotation, and the cooling fin 8A preferably has a left rotation. In an arrangement with a sequence of cooling fin 8C (right rotation), cooling fin 8B (right rotation) and cooling fin 8A (left rotation) from the left, the cooling fluid flows from the upper side to the lower side and merges at a merge point (between cooling fin 8A and cooling fin 8B) of the cooling fluid flowing through both flow paths of cooling fin 8A and cooling fin 8B. For this reason, it is estimated that the heat of the top plate 7a on the upper side is readily transmitted to the lower side by hitting the top plate 7a after the merging.

Also, when a plurality of cooling fins are arranged, flow toward the center part side is readily obtained when the cooling fluid flows out from the quadrangular column-shaped cooling fins, as shown in FIG. 3(a). Moreover, if the right-side cooling fin has left rotation, flow toward the center side can be readily obtained, it is therefore estimated that turbulent flow is unlikely to occur, and cooling efficiency is therefore good and loss is low.

Consequently, when the arrangement includes cooling fins whose rotation direction is in the opposite direction, the preferred sequence is for the cooling fins on the left side from the center part of the cooler to have right rotation and the cooling fin on the right side to have left rotation, viewed from the inflow direction of the cooling fluid. For example, when six rows of cooling fins are arranged, the sequence can be, from the left side, right rotation, right rotation, right rotation, left rotation, left rotation, and left rotation. The same result applies also to the case without the later-described straight fins.

[The Case without Straight Fins]

Figure 4:
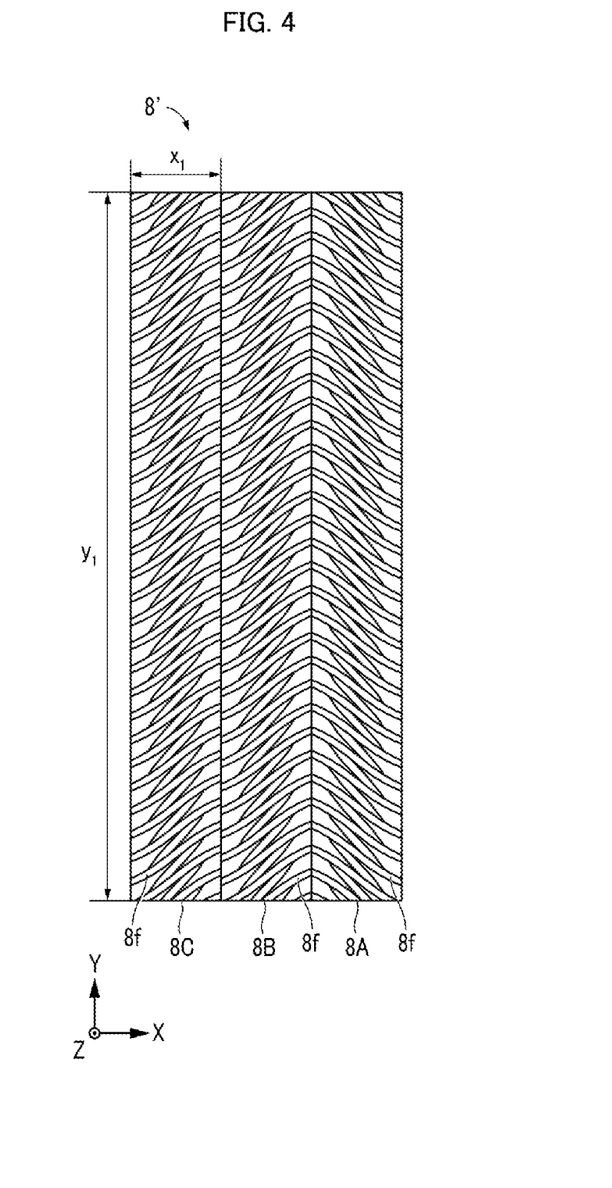
FIG. 4 is a plan view showing another example of an array of cooling fins.

FIG. 4 shows another example in which the arrangement of the cooling fins 8A, 8B, 8C has been changed (cooling fins 8'). In this example, the vane parts 8b (curved fins 8f extending out of the vane parts 8b) of the adjacent cooling fins 8A, 8B, and 8C are in contact with each other, and the spiral directions are opposite to each other. By adopting such an arrangement, for example, even if the fluid flowing through the flow path of the cooling fin 8A flows into the flow path of the cooling fin 8B, counter flow is unlikely to occur and turbulent flow is unlikely to occur. For this reason, pressure loss can be minimized without partitioning with the straight fin 8S.

In the same manner as the straight fins included, when a plurality of cooling fins are arranged, cooling fins with the spiral direction in a right rotation (clockwise) are preferably disposed on the leftmost side as viewed from the inflow direction of the cooling fluid, and cooling fins with a left rotation (counterclockwise) are preferably disposed on the rightmost side. For example, when four rows of cooling fins are arranged, the sequence from the left side is preferably right rotation, right rotation, left rotation, and left rotation.

Figures 8A, 8B:
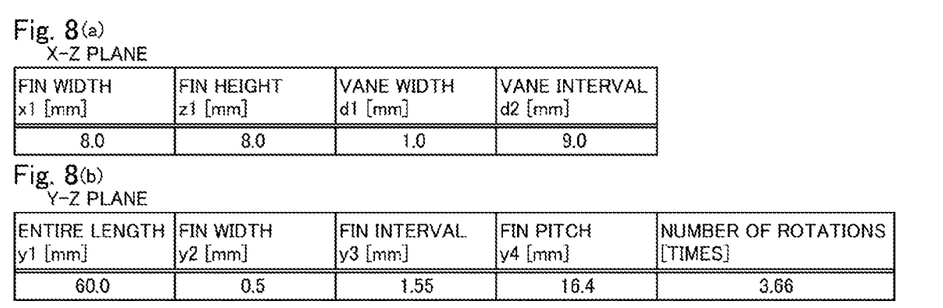
FIG. 8(a) indicates the size of each portion of the cooling fins (X-Z plane)
FIG. 8(b) indicates the size of each portion of the cooling fins (Y-Z plane)

FIG. 3(c) is a perspective view of the cooling fin 8A. The cooling fin 8A is composed of a central shaft part 8a and eight vane parts 8b (vane width $d_1$=1.0 mm) protruding outward from the shaft part 8a when viewed from the front direction (−Y-axis direction). The fin width $x_1$ (lateral width) and the fin height $z_1$ are both 8.0 mm (see FIG. 8).

Here, the cross-sectional area (X-Z plane) of the shaft part 8a is preferably 10 to 60% of the cross-sectional area (X-Z plane) of the quadrangular column, the cross-sectional areas being perpendicular to the cooling fins in the long axis direction, and is more preferably 30 to 50%. This is the ratio of the cross-sectional area of the shaft part 8a to the total cross-sectional area of the quadrangular column of the cooling fin, and also relates to the ratio of the vane parts 8b and is a shape parameter that affects the cooling efficiency.

When the cross-sectional area of the shaft part 8a is small (the ratio of the vane parts 8b is high) and a large amount of fluid flows to the cooling fin 8A, the flow rate is reduced, and the cooling efficiency therefore decreases. When the cross-sectional area of the shaft part 8a is large (the ratio of the vane parts 8b is low) and the amount of fluid that flows to the cooling fin 8A is low, the cooling efficiency is also expected to decrease because the cooling medium is reduced.

Described next are simulation results in which, actually using thermal fluid analysis software, the shape parameters of the cooling fins 8 of the present invention are actually varied and measurements are made of the temperature T of the top plate 7a of the cooler 6 and the pressure loss $P_L$. It is noted that the results from some of actually fabricated prototypes tend to be the same as the simulation results.

Figure 5:
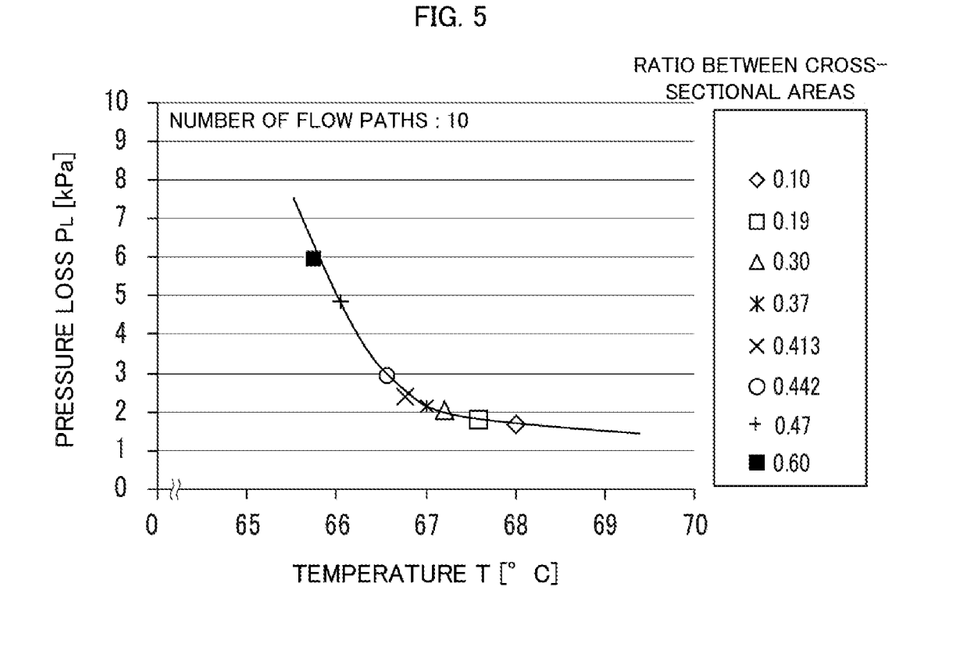
FIG. 5 shows the results of a simulation of temperature and pressure loss when the ratio of the cross-sectional area of the shaft part to that of the quadrangular column of the cooling fin has been varied.

FIG. 5 shows the results of a simulation of temperature T of the top plate 7a and the pressure loss $P_L$ obtained by setting the number of flow paths to 10 and the fin pitch to 30 mm, and varying the ratio of the cross-sectional area of the shaft part 8a to that of the quadrangular column of the cooling fin 8A. As indicated in FIG. 5, when the ratio with the areas is low, i.e., when the cross-sectional area of the shaft part 8a is small (the ratio of the vane parts is high), a large amount of fluid flows to the cooling fin 8A, and therefore, the pressure loss $P_L$ is reduced, but the temperature T increases.

Meanwhile, when the ratio with the areas is high, i.e., when the cross-sectional area of the shaft part 8a is large (the ratio of the vane parts is low), the amount of fluid that flows to the cooling fin 8A is reduced. Accordingly, the flow rate is greater, and the temperature T is therefore decreased, but the pressure loss $P_L$ increases. Therefore, the above-stated range is preferred as the range in which the temperature T and the pressure loss $P_L$ are balanced. The pressure loss $P_L$ is preferably a value that is less than 15 kPa so that the long-term reliability of the device is not compromised.

The temperature T is obtained by measuring the temperature near the center of the top plate 7a of the cooler 6 using a heat-insulating device (not shown) that includes a heater. In particular, the output of the heater was 1,110 (W), pure water was used as the cooling fluid, and the inflow rate from the inlet 7d was 4.0 (L/min). The pressure loss $P_L$ was evaluated as the difference between the pressure at the inlet 7d of the cooler 6 and the pressure at the outlet 7e under the same inflow rate conditions.

The cross-sectional area of the shaft part 8a of the cooling fin 8A is set to be within the above range so that an appropriate amount of fluid will flow into the cooling fin 8A. Thereby, the pressure loss $P_L$ can be kept low, and the cooling efficiency can be furthermore increased.

[Interval and Partition Number in the Vane Parts and Number of Vanes]

It is also effective to arrange the vane parts 8b at equidistant intervals (in this configuration, the vane interval $d_2$ is 0.9 mm) around the shaft part 8a. The cooling fluid that has flowed into the cooling fin 8A can thereby be made to flow evenly through around the shaft part; therefore, an object to be cooled that has been brought into contact with the cooling fins in any direction can be cooled. The number of vane parts 8b is an important shape parameter that affects cooling efficiency, and is preferably about 4 to 10.

Figure 6:
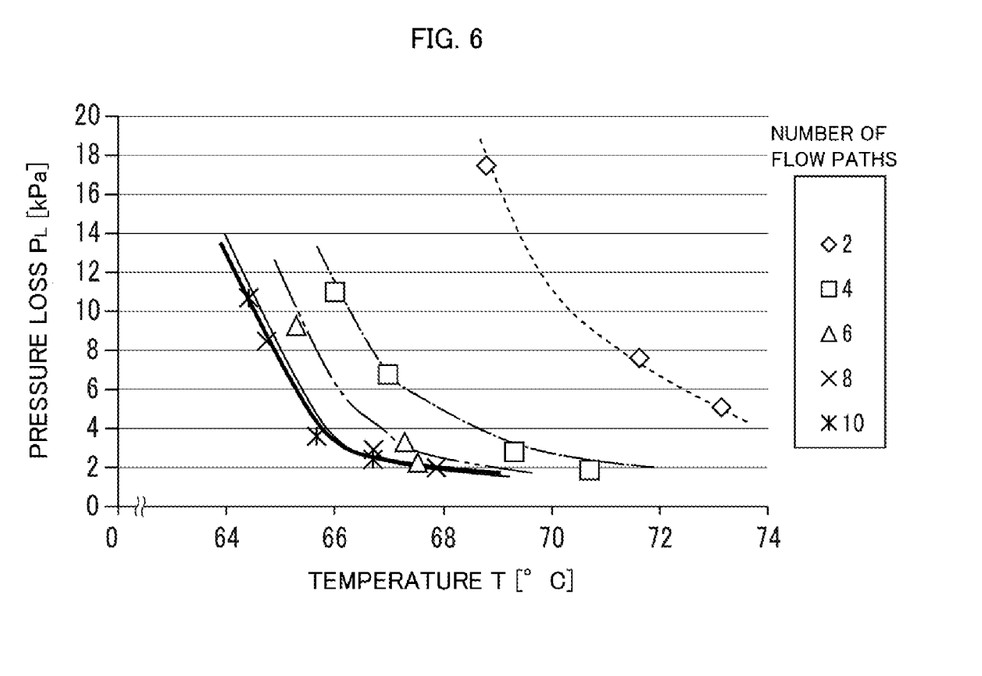
FIG. 6 shows the results of a simulation of temperature and pressure loss when the number of vane parts has been varied.

FIG. 6 shows the results of a simulation of temperature T of the top plate 7a and pressure loss $P_L$ obtained by varying the number of vane parts 8b (number flow paths). The fin pitch was varied between 15 mm and 45 mm.

As indicated in FIG. 6, it was found that even when the number of flow paths is 8 or more, the cooling characteristics substantially do not change. When the number of flow paths was two, cooling efficiency was poor, but cooling efficiency was good with four flow paths. Here, the cooling characteristics are the relationship between the temperature T and pressure loss $P_L$. A region in which the temperature T is low and the pressure loss $P_L$ is minimal is preferred. The number of vane parts 8b corresponds to the number of flow paths. That is to say, if the number of vane parts 8b is eight, then eight flow paths are formed.

As shown in the above-mentioned FIG. 4, when there are no straight fins and a plurality of cooling fins are connected, the vane interval is preferably the same as the vane interval between adjacent cooling fins in order to prevent turbulent flow of the cooling fluid.

[Shape of Vane Parts: Spiral-Formed Flow Path]

Returning to FIG. 3(c), a curved fin 8/1 extends spirally from "1" of the vane parts 8b (hereinafter referred to as the vane part 8b1) in the long axis direction (Y-axis direction). From the vane part 8b2, a curved fin 8/2 behind the curved fin 8/1 extends spirally in the same long axis direction.

From the vane part 8b8, a curved fin 8/8 extends spirally in the long axis direction, and the rear thereof returns to the curved fin 8/1 extending from the vane part 8b1. In other words, the flow path between the vane part 8b1 (curved fin 8/1) and the vane part 8b2 (curved fin 8/2) turns spirally and appears again, and this is repeated. Other flow paths are the same, and each form an independent spiral flow path.

Figures 7A, 7B:
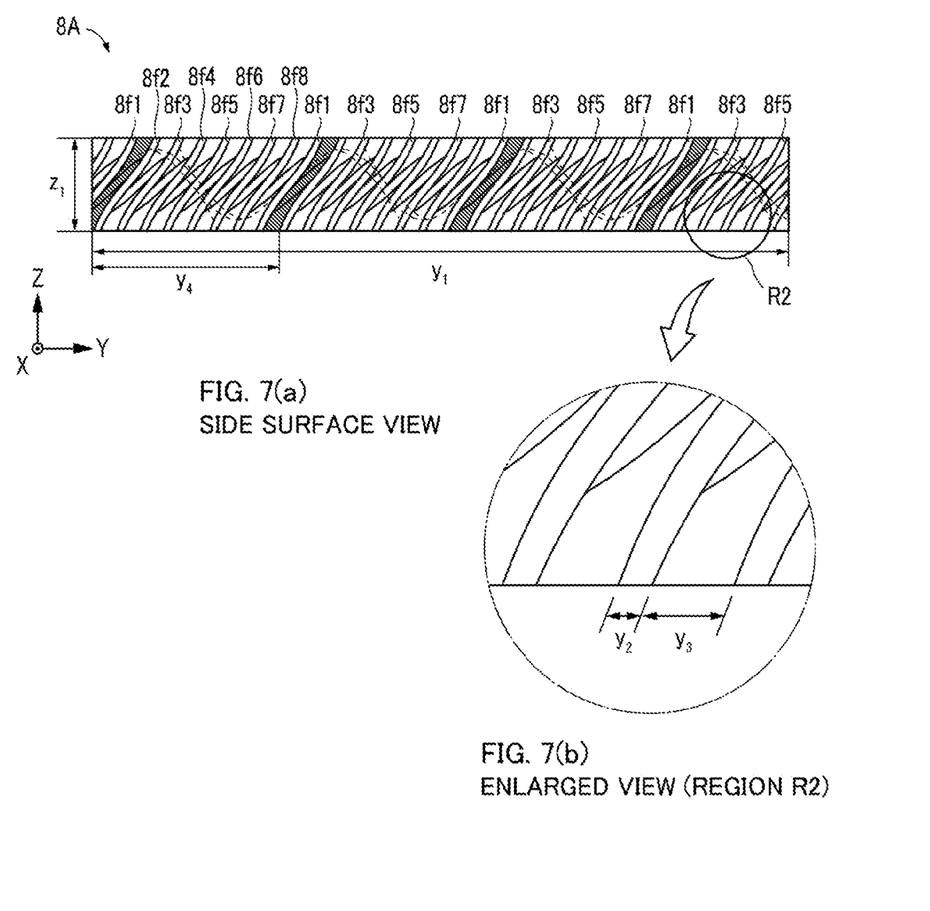
FIG. 7(a) is a side surface view of the cooling fins.
FIG. 7(b) is an enlarged view of the region R2 of the cooling fins.

Next, FIG. 7(a) shows a side surface view of the cooling fin 8A. The length (overall length $y_1$) in the long axis direction (Y-axis direction) of the cooling fin 8A is 60.0 mm. A flow path between the vane part 8b1 (curved fin 8/1) and the vane part 8b2 (curved fin 8/2) extends spirally as indicated by the broken line (partially shaded).

FIG. 7(b) is an enlarged view of region R2 of FIG. 7(a). Here, the fin width $y_2$ is 0.5 mm, the fin interval $y_3$ is 1.55 mm, and therefore the width as one flow path is 2.05 mm. Since eight flow paths constitute a single period, the fin pitch $y_4$ is 16.4 mm (see FIG. 8).

[Spiral Configuration Parameter: Spiral Pitch]

Dividing the overall length $y_1$ of the cooling fin 8A by the fin pitch $y_4$ yields the number of rotations, and if the overall length $y_1$ is 60.0 mm and the fin pitch $y_4$ is 16.4 mm, then there are 3.66 rotations. This means that there are 3.66 spiral turns in the entire length $y_1$ of the cooling fin 8A. The fin pitch, more precisely, indicates the period of spiral rotation.

The axial pitch (fin pitch $y_4$) of the vane parts 8b is preferably a length amounting to 1.5 to 6.25 times the fin height $z_1$, and more preferably 2 to 5 times. This is the ratio of the axial-direction fin pitch $y_4$ to the fin height $z_1$ and is a shape parameter that affects cooling efficiency. Setting the ratio to this range makes it possible reduce the pressure loss of the cooling fluid flowing through the flow path, and to reduce the temperature.

Figure 9:
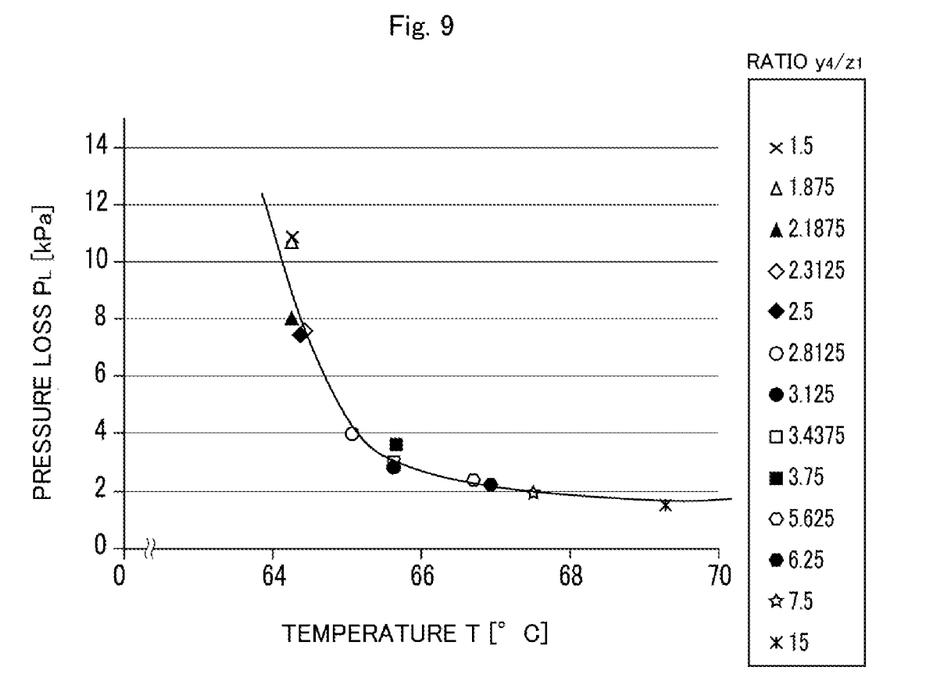
FIG. 9 shows the results of a simulation of temperature and pressure loss when the ratio of the axial fin pitch to the fin height has been varied.

Described next with reference to FIG. 9 are the results of a simulation of varying the ratio of the fin pitch in the axial direction with respect to the fin height, which is a shape parameter of the cooling fin 8, and measuring the temperature T of the top plate 7a and the pressure loss $P_L$. The number of flow paths was 10, and the fin pitch was varied between 15 mm and 45 mm.

When the ratio is high, the fin pitch increases, the number of rotations decreases, and the pressure loss $P_L$ falls, but the temperature T increases. On the other hand, when the ratio is low, the fin pitch decreases, the number of rotations increases, and the temperature T falls, but the pressure loss $P_L$ increases. Therefore, the above-stated range is preferred as the range in which the temperature T and the pressure loss $P_L$ are balanced.

[Thickness of Vane Part]

The thickness (fin width $y_2$) of the vane parts 8b is preferably 10 to 60% of the length obtained by dividing the axial pitch (fin pitch $y_4$) of the vane parts 8b by the number of vanes, and is more preferably 20 to 40%. This is the ratio of $y_2/(y_2+y_3)$ (see FIG. 7(b)), which is the ratio of the fin width to the sum of the fin interval and the fin width as viewed from the Y-Z plane. Also, in order to prevent clogging of particles in the cooling fluid, the fin interval is preferably 0.9 mm or greater. The pressure loss of the fluid flowing through the flow path can be reduced thereby as well.

[Angle of Vane Part]

When the width of the vane parts 8b have the same shape as the cooling fin 8A shown in FIG. 3(c), the width of the flow path increases more greatly in progression to the outer periphery from the shaft part 8a. When the width of the flow path increases, the fluid more readily flows to the exterior, the cooling of the shaft part 8a worsens, and the cooling efficiency for the cooler does not improve.

Figure 10:
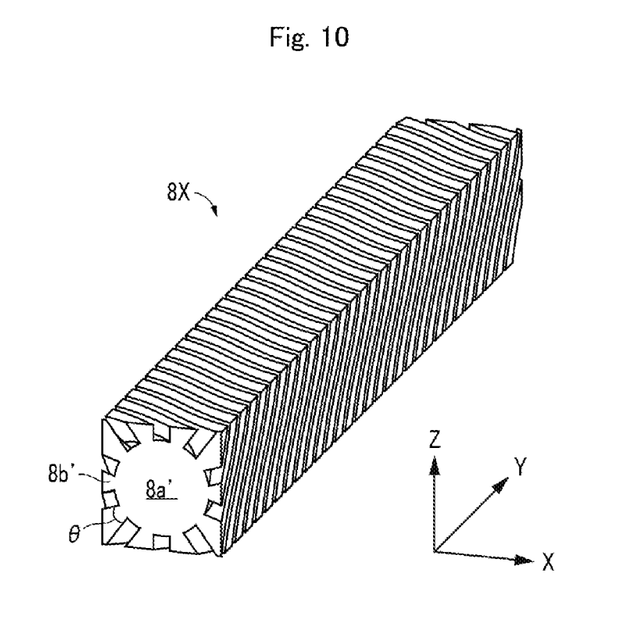
FIG. 10 is a perspective view of the cooling fins (modification)

In view of the foregoing, it is preferred that the vane part be angled (vane parts 8b') so that the width of the flow path is the same even in progression to the outer periphery from the shaft part 8a', as with the cooling fin 8X shown in FIG. 10. The angle θ of one vane parts 8b' in the cross section (X-Z plane) is preferably 30 to 45 degrees, and more preferably 36 degrees.

Figure 11:
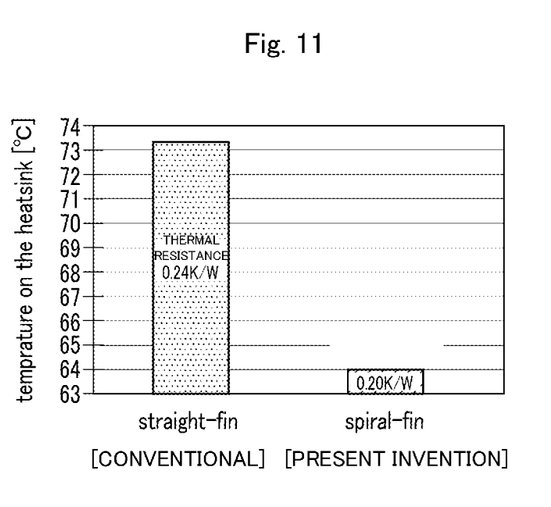
FIG. 11 shows the result of comparing the cooling performance of the cooling fins of the present invention and fins having a conventional structure.

Last, a description shall be given, with reference to FIG. 11, of the results obtained by comparing the cooling performance of the cooling fins of the present invention and the cooling performance of fins having a conventional-art structure.

The inventors fabricated an experimental metal cooling fin for measurement (spiral flow path) using a 3D printer, and arranged six of the cooling fins to yield a single cooler. The parameters of the cooling fins used here are the numerical values shown in FIG. 8. The length of the entire cooling fin in the straight fin cooler, which represents conventional art, also has the same length as that of the cooling fin of the present invention at 60 mm. The pitch of the straight fins is 0.5 mm.

First, a straight fin (conventional art) that is the same size as the experimental cooling fin has a thermal resistance of 0.24 (K/W), which indicates the difficulty in transferring temperature, and the temperature on the fin was 73(° C.) or higher.

On the other hand, the cooling fins of present invention having a spiral flow path have a thermal resistance of 0.20 (K/W), and the temperature on the fins was about 64(° C.). In other words, the cooling fins of the present invention successfully reduced thermal resistance by 16.7% in comparison with the straight fins of the conventional art.

The cooler 6 and semiconductor module 100 pertaining to an embodiment of the present invention were described above, but the present invention is not limited to the embodiment described above. In particular, the size of the cooling fins, the number of vane parts, and the ratio of the cross-sectional area of the shaft part can be varied in accordance with the purpose. In the present embodiment, the number of vanes is eight, but even when ten vanes are used, the numerical range and ratio above-described as preferred for increasing the cooling efficiency or reducing the pressure loss are the same.

Moreover, a case in which straight fins are disposed between the cooling fins of the present invention has been described (see FIG. 3). In this case, the fluid does not flow into the flow path of the adjacent cooling fin, and the spiral direction of the vane part (curved fin) may therefore be the same or the orientation may be different.

NUMERIC SYMBOL 1a, 1b Semiconductor element
2a to 2c Metal joining member
3 Wiring substrate
4 Pin
5 Laminated substrate
6 Cooler
7 Cooler case
7a Top plate
7b Bottom plate
7c Side plate
7d Inlet
7e Outlet
8, 8', 8A to 8C, 8X Cooling fins
8S Straight fins
8a, 8a' Shaft part
8b, 8b', 8b1 to 8b8 Vane parts
8f, 8f1 to 8f8 Curved fins
9 Case
10 Resin
51 First electroconductive plate
52 Insulation substrate
53 Second electroconductive plate
100 Semiconductor module

What is claimed is:

1. A cooler comprising: a case having a top plate, a bottom plate, and a side plate, cooling fins disposed inside said case, and a flow path for cooling fluid that comes into contact with said cooling fins and that flows through an interior of the case, the cooler being for cooling an object to be cooled in contact with the top plate or the bottom plate,
wherein each of the cooling fins has a shaft part and vane parts that protrude outward from the shaft part and extend in an axial direction so as to form a spiral configuration, an overall shape of the cooling fin having a quadrangular column shape and being disposed in contact with at least the top plate and the bottom plate; and
the flow path has a spiral-formed configuration formed by the vane parts, the top plate, and the bottom plate.

2. The cooler according to claim 1, wherein the vane parts are arranged at equidistant intervals around the shaft part.

3. The cooler according to claim 1, wherein an axial pitch of the vane parts has a length amounting to 1.5 to 6.25 times a height of the quadrangular column shape.

4. The cooler according to claim 1, wherein a cross-sectional area of the shaft part is 10 to 60% of a cross-sectional area of the quadrangular column shape in a cross-section axially perpendicular to said quadrangular column shape.

5. The cooler according to claim 1, wherein a thickness of each of the vane parts is 10 to 60% of a length obtained by dividing an axial pitch of the vane parts by a number of vanes.

6. The cooler according to claim 1, wherein a plurality of the cooling fins is disposed in parallel inside the case.

7. The cooler according to claim 6, wherein a straight fin is disposed between the parallel cooling fins, and in contact with the parallel cooling fins.

8. The cooler according to claim 6, wherein, in mutually adjacent cooling fins, the vane parts are in mutual contact, and spiral directions of spiral-formed configuration of the vane parts are in opposite directions.

9. A semiconductor module comprising: a semiconductor element; a laminated substrate on which the semiconductor element is mounted and which has a structure in which an upper surface and a lower surface of an insulation substrate are sandwiched by electroconductive plates; and a cooler through which cooling fluid for cooling the semiconductor element flows, the cooler being joined to a side of the laminated substrate on which the semiconductor element is not mounted, and the cooler being the cooler of claim 1.

* * * * *